(12) United States Patent
Kanatani et al.

(10) Patent No.: US 11,343,932 B2
(45) Date of Patent: May 24, 2022

(54) ELECTRICAL DEVICE AND COMPONENT FOR ELECTRICAL DEVICE

(71) Applicant: YOKOGAWA ELECTRIC CORPORATION, Musashino (JP)

(72) Inventors: Nobuhiro Kanatani, Musashino (JP); Takuya Nidaira, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 72 days.

(21) Appl. No.: 16/888,858

(22) Filed: Jun. 1, 2020

(65) Prior Publication Data

US 2020/0389992 A1 Dec. 10, 2020

(30) Foreign Application Priority Data

Jun. 4, 2019 (JP) .............................. JP2019-104811

(51) Int. Cl.
*H05K 5/04* (2006.01)
*H05K 5/00* (2006.01)
*H05K 9/00* (2006.01)

(52) U.S. Cl.
CPC .............. *H05K 5/04* (2013.01); *H05K 5/006* (2013.01); *H05K 9/0064* (2013.01)

(58) Field of Classification Search
CPC .................................. H05K 5/04; H05K 5/006
See application file for complete search history.

(56) References Cited

U.S. PATENT DOCUMENTS

| 5,392,197 | A | * | 2/1995 | Cuntz | .................. | H05K 5/0047 |
| | | | | | | 174/377 |
| 6,819,559 | B1 | | 11/2004 | Seeger et al. | | |
| 7,561,435 | B2 | * | 7/2009 | Kamoshida | .......... | H05K 5/0052 |
| | | | | | | 174/50.5 |
| 2007/0218721 | A1 | | 9/2007 | Naritomi | | |
| 2013/0054862 | A1 | * | 2/2013 | Tsai | ..................... | H05K 5/0282 |
| | | | | | | 710/301 |
| 2017/0353020 | A1 | * | 12/2017 | Yamashita | ......... | H05K 7/20445 |

FOREIGN PATENT DOCUMENTS

| DE | 1129238 A1 | 3/1993 |
| DE | 112015005727 T5 | 8/2017 |
| JP | 3021144 U | 2/1996 |
| JP | 2016157757 A | 9/2016 |
| JP | 2017079253 A | 4/2017 |
| JP | 2018185911 A | 11/2018 |
| JP | 2018206999 A | 12/2018 |
| WO | 2016104108 A1 | 6/2016 |

* cited by examiner

*Primary Examiner* — Hung V Ngo
(74) *Attorney, Agent, or Firm* — Kenja IP Law PC

(57) ABSTRACT

Provided are an electrical device and a component for an electrical device that can efficiently suppress the occurrence of a short circuit between a housing and a circuit board. The electrical device includes a housing and a circuit board housed inside the housing. The housing includes a metallic main housing to be attached to an installation section and a sub-housing attached to the main housing. The main housing includes a main wall, extending along the circuit board with a gap between the main wall and the circuit board, and a board attachment portion having the circuit board attached thereto. An insulating plate having insulating properties is fixed to an inner surface of the main wall.

5 Claims, 3 Drawing Sheets

ELECTRICAL DEVICE AND COMPONENT FOR ELECTRICAL DEVICE

CROSS-REFERENCE TO RELATED APPLICATION

The present application claims priority to and the benefit of Japanese Patent Application No. 2019-104811 filed Jun. 4, 2019, the entire contents of which are incorporated herein by reference.

TECHNICAL FIELD

The present disclosure relates to an electrical device and a component for an electrical device.

BACKGROUND

Electrical devices structured to suppress the occurrence of short circuits so as to enable safe use in explosive atmospheres and the like are known. For example, patent literature (PTL) 1 discloses a structure for suppressing the occurrence of a short circuit between a housing and a cable that connects circuit boards housed inside the housing.

CITATION LIST

Patent Literature

PTL 1: JP2016157757A

SUMMARY

An electrical device according to an embodiment includes a housing and a circuit board housed inside the housing. The housing includes a metallic main housing to be attached to an installation section and a sub-housing attached to the main housing. The main housing includes a main wall, extending along the circuit board with a gap between the main wall and the circuit board, and a board attachment portion having the circuit board attached thereto. An insulating plate having insulating properties is fixed to an inner surface of the main wall.

DETAILED DESCRIPTION

Figure 1:
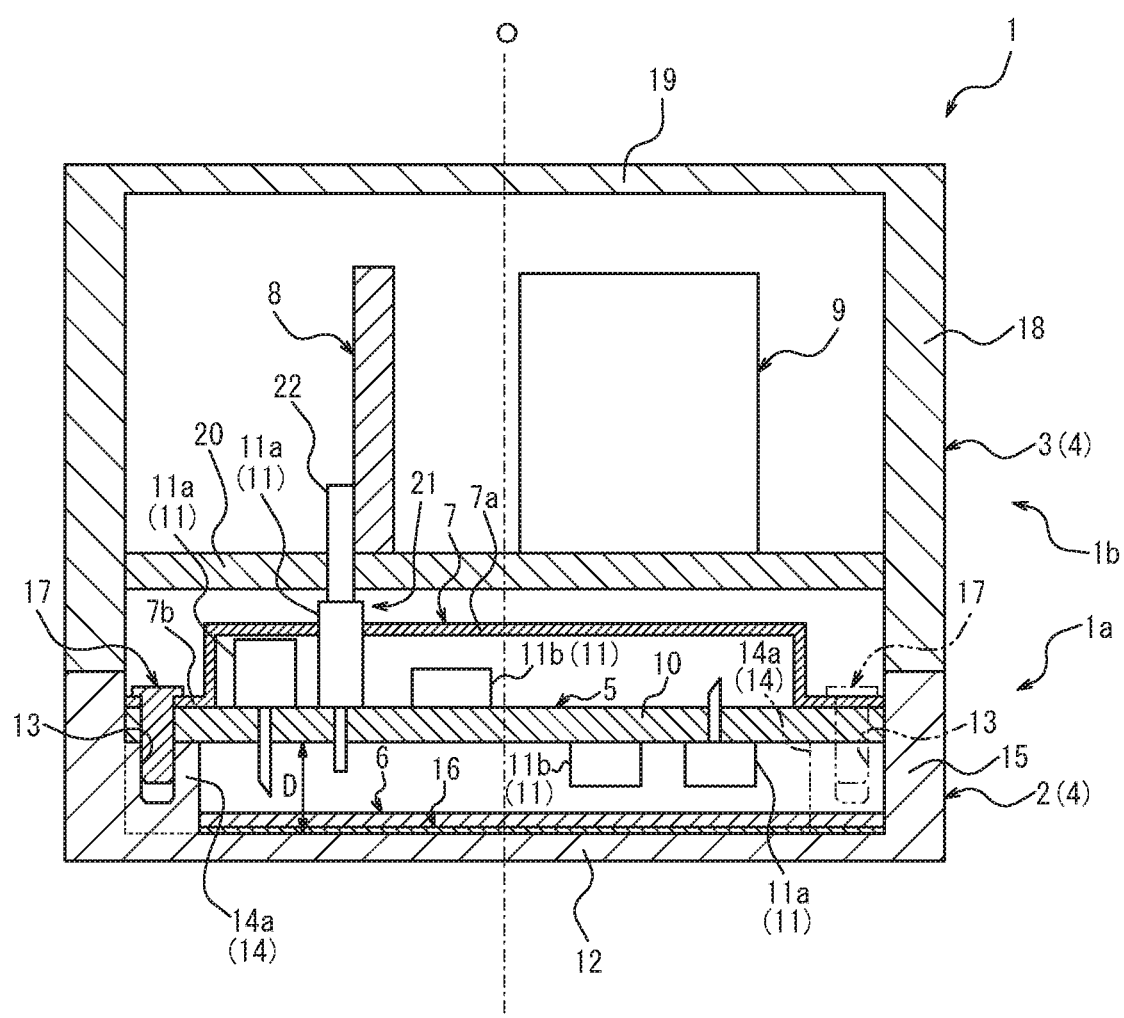
FIG. 1 is a cross-sectional diagram illustrating an electrical device according to a first embodiment.

Electrical devices are required to suppress the occurrence of a short circuit between the housing and a circuit board that includes electronic components. However, attempting to suppress the occurrence of a short circuit only by the spatial distance between the circuit board and the metallic portion of the housing located around the circuit board makes it difficult to reduce the electrical device in size or to comply with size restrictions of the electronic components usable to configure the circuit board. It could therefore be helpful to provide an electrical device and a component for an electrical device that can efficiently suppress the occurrence of a short circuit between the housing and the circuit board.

An electrical device according to an embodiment includes a housing and a circuit board housed inside the housing. The housing includes a metallic main housing to be attached to an installation section and a sub-housing attached to the main housing. The main housing includes a main wall, extending along the circuit board with a gap between the main wall and the circuit board, and a board attachment portion having the circuit board attached thereto. An insulating plate having insulating properties is fixed to an inner surface of the main wall. The insulating plate can provide efficient insulation between the circuit board and the main wall of the metallic main housing. The gap necessary for insulation between the circuit board and the main wall can therefore be reduced, enabling a reduction in size of the electrical device or compliance with restrictions on the size of electronic components usable to configure the circuit board. Furthermore, since the main housing is metallic, the electrical device can be installed stably on the installation section.

The electrical device configured as above may, in an embodiment, further include an insulating cover having insulating properties and covering a surface of the circuit board on an opposite side from the main wall. This configuration enables efficient suppression, using the insulating cover, of the occurrence of a short circuit between the surface of the circuit board on the opposite side from the main wall and conductors and the like located around the surface.

The electrical device configured as above may, in an embodiment, be configured so that the circuit board and the insulating cover in the electrical device are jointly fastened to the board attachment portion by a fastener. This configuration enables an efficient structure and assembly for attaching the insulating cover.

The electrical device configured as above may, in an embodiment, be configured so that the main housing includes a protrusion protruding from the inner surface of the main wall, and the board attachment portion is provided on the protrusion. This configuration enables an efficient structure and assembly for attaching the circuit board.

The electrical device configured as above may, in an embodiment, be configured so that the board attachment portion is provided on the inner surface of the main wall, the circuit board is attached via a stud to the board attachment portion provided on the inner surface of the main wall, and the insulating plate is fixed by being fastened to the inner surface of the main wall by the stud. This configuration enables an efficient structure and assembly for attaching the insulating plate.

The electrical device configured as above may, in an embodiment, be configured so that the sub-housing has insulating properties, and a wireless communication module is housed inside the sub-housing. With this configuration, the sub-housing has insulating properties, enabling suppression of a short circuit between the circuit board and the housing and enabling stable wireless communication by the wireless communication module.

The electrical device configured as above may, in an embodiment, be configured so that the insulating plate has withstand voltage characteristics conforming to a requirement of solid insulation in an intrinsically safe explosion-proof structural standard and has a thickness conforming to a requirement of separation distance through solid insulation in the intrinsically safe explosion-proof structural standard.

This configuration can advantageously conform to intrinsically safe explosion-proof structural standards.

The electrical device configured as above may, in an embodiment, be configured so that the insulating plate is fixed to the inner surface of the main wall by being fitted onto the main housing by snap fitting, pressure fitting, or the like. This configuration enables an efficient structure and assembly for attaching the insulating plate.

The electrical device configured as above may, in an embodiment, be configured so that the insulating plate is fixed by being fastened to the inner surface of the main wall by a fastener. This configuration enables an efficient structure and assembly for attaching the insulating plate.

The electrical device configured as above may, in an embodiment, be configured so that the fastener that fixes the insulating plate to the inner surface of the main wall has insulating properties. This configuration enables a reduction in the distance, between the circuit board and the main wall, necessary for insulation.

The electrical device configured as above may, in an embodiment, be configured so that the insulating plate is fixed to the inner surface of the main wall via an adhesive member, such as double-sided tape or adhesive. This configuration enables an efficient structure and assembly for attaching the insulating plate. The insulating plate can also be reliably fixed to the inner surface by the adhesive member.

The electrical device configured as above may, in an embodiment, be configured so that the insulating plate is fixed to the inner surface of the main wall in a state such that the insulating plate touches the inner surface of the main wall without the aforementioned adhesive member or the like therebetween. This configuration enables a reduction in the distance, between the circuit board and the main wall, necessary for insulation.

A component for an electrical device according to an embodiment includes a metallic main housing, to be attached to an installation section, and a circuit board. The main housing includes a main wall, extending along the circuit board with a gap between the main wall and the circuit board, and a board attachment portion having the circuit board attached thereto. An insulating plate having insulating properties is fixed to an inner surface of the main wall. The insulating plate can provide efficient insulation between the circuit board and the main wall of the metallic main housing. The gap necessary for insulation between the circuit board and the main wall can therefore be reduced, enabling a reduction in size of the electrical device or compliance with restrictions on the size of electronic components usable to configure the circuit board. Furthermore, since the main housing is metallic, the electrical device can be installed stably on the installation section.

The present disclosure can provide an electrical device and a component for an electrical device that can efficiently suppress the occurrence of a short circuit between the housing and the circuit board.

Embodiments of the present disclosure are described below with reference to the drawings.

First, an electrical device 1 according to a first embodiment is described with reference to FIG. 1. As illustrated in FIG. 1, the electrical device 1 according to the present embodiment includes a housing 4, a circuit board 5, an insulating plate 6, an insulating cover 7, a wireless communication module 8, and a power supply 9. The housing 4 is formed by a main housing 2 and a sub-housing 3. The electrical device 1 is configured by main housing-side components 1a (component for electrical device), which include the main housing 2 and the components housed inside the main housing 2 (such as the circuit board 5, the insulating plate 6, and the insulating cover 7), and sub-housing-side components 1b, which include the sub-housing 3 and the components housed in the sub-housing 3 (such as the wireless communication module 8 and the power supply 9).

The electrical device 1 is a measurement device serving as a field device, such as a thermometer, a pressure gauge, a flow meter, or a vibration meter. The electrical device 1 is not, however, limited to being a measurement device serving as a field device. The electrical device 1 may be a field device other than a measurement device or may be an electrical device other than a field device. A field device is a device used in a plant. Examples of field devices other than measurement devices include valve devices, such as flow control valves and opening/closing valves; actuators, such as fans or motors; image capturing devices, such as cameras and video recorders, that capture images of the conditions and objects in the plant; acoustic devices, such as microphones that collect abnormal noises and the like inside the plant and speakers that emit warning sounds or the like; and position detectors that output position information of various devices. Examples of the plant include an industrial plant such as a chemical plant; a plant for managing a well site, such as a gas field or oil field, and the surrounding area; a plant for managing power generation such as hydroelectric power, thermal power, nuclear power, or the like; a plant for managing environmental power generation such as solar power, wind power, or the like; and a plant for managing water and sewage, a dam, or the like.

The main housing 2 is attached to a desired installation section (not illustrated) in the plant by a fastener, such as a screw, or by a belt, magnet, or the like. The main housing 2 can be attached to the installation section via an intermediate member, such as a bracket, or directly without the use of an intermediate member. The main housing 2 is metallic to allow stable installment on the installation section. In other words, by virtue of being metallic, the main housing 2 has good attachment strength, vibration resistance, and heat resistance. The main housing 2 also has conductivity by virtue of being metallic. A structure for suppressing the occurrence of a short circuit between the main housing 2 and the circuit board 5 is therefore necessary.

The circuit board 5 is housed inside the main housing 2. The circuit board 5 includes a discoid board body 10 having a central axis O at the center and electronic components 11 mounted on the board body 10. The electronic components 11 include insertion components 11a mounted on the upper surface of the board body 10, surface mounted components 11b mounted on the upper surface of the board body 10, insertion components 11a mounted on the lower surface of the board body 10, and surface mounted components 11b mounted on the lower surface of the board body 10. However, the electronic components 11 may instead be mounted on only one of the upper surface and lower surface of the board body 10. The electronic components 11 may instead include only the insertion components 11a or the surface mounted components 11b. The board body 10 is not limited to being discoid and may be a plate with any shape, such as a triangle, a rectangle, a polygon, or the like.

The main housing 2 includes a main wall 12 extending along the board body 10 of the circuit board 5, with a gap D between the main wall 12 and the board body 10, and a board attachment portion 13 to which the board body 10 is attached. The main wall 12 extends in parallel with the board body 10, but this example is not limiting. The main wall 12 may be slightly inclined with respect to the board body 10 as long as the main wall 12 extends along the board body 10. The main housing 2 includes a protrusion 14 that protrudes from the inner surface (i.e. the upper surface) of the main wall 12. The board attachment portion 13 is provided on the upper surface of the protrusion 14. The lower end of a cylindrical circumferential wall 15 is integrally connected to the outer circumferential edge of the discoid main wall 12 that is centered on the central axis O. The protrusion 14 is formed by a plurality of convex portions 14*a* that are disposed at intervals in the circumferential direction and protrude from both the inner circumferential surface of the circumferential wall 15 and the inner surface of the main wall 12. The protrusion 14 is not limited to being formed by a plurality of convex portions 14*a*, however, and may be formed by an annular convex portion that extends across the entire circumference, for example. The board attachment portion 13 is not limited to being provided on the protrusion 14. For example, the board attachment portion 13 may be provided on the inner surface of the main wall 12, and the circuit board 5 may be attached via a stud 23 to the board attachment portion 13 provided on the inner surface of the main wall 12, as in the second embodiment, described below.

The central axis O is the central axis shared by the circuit board 5 (board body 10) and the housing 4 (main wall 12). The central axes of the circuit board 5 and the housing 4 may, however, be shifted from each other. The main wall 12 is not limited to being discoid and may be a plate with any shape, such as a triangle, a rectangle, a polygon, or the like. The circumferential wall 15 is not limited to being cylindrical, and the shape thereof can be changed as necessary to match the shape of the main wall 12. The shapes of the main wall 12 and the board body 10 are equivalent, but this example is not limiting, and these shapes may differ.

In the present disclosure, the circumferential direction refers to the direction about the central axis O. The radial direction refers to the direction orthogonal to the central axis O. The vertical direction refers to the direction along the central axis O. Upwards refers to the direction from the main wall 12 towards the circuit board 5, and downwards refers to the opposite direction.

The insulating plate 6, which is a plate with insulating properties, is fixed to the inner surface of the main wall 12. The insulating plate 6 has a uniform thickness across the entire surface, but this example is not limiting. The thickness may vary somewhat as long as the shape is a plate. The insulating plate 6 is a circular plate with notches at positions corresponding to the plurality of convex portions 14*a*. The shape of the insulating plate 6 is not limited to this example, however, and can be changed as necessary to match the shape of the main wall 12 and the protrusion 14. The insulating plate 6 preferably has a shape and size substantially covering the entire surface of the main wall 12 but may instead have a shape covering only a portion of the main wall 12. The insulating plate 6 may be made of synthetic resin, such as polycarbonate resin. For the electrical device 1 to conform to intrinsically safe explosion-proof structural standards, the insulating plate 6 has withstand voltage characteristics conforming to the requirements of solid insulation in the intrinsically safe explosion-proof structural standards and a thickness conforming to the requirements of separation distance through solid insulation in the intrinsically safe explosion-proof structural standards. The voltage characteristics conforming to the requirements of solid insulation in the intrinsically safe explosion-proof structural standards refer to the resistance to voltage occurring between the circuit board 5 and the main wall 12. The thickness conforming to the requirements of separation distance through solid insulation in the intrinsically safe explosion-proof structural standards refers to a thickness equivalent to or greater than the separation distance of the requirements. The insulating plate 6 is not limited to having such withstand voltage characteristics and thickness. For example, the insulating plate 6 may have withstand voltage characteristics and a thickness for the electrical device 1 to conform to explosion-proof structural standards other than intrinsically safe explosion-proof structural standards (such as type-n explosion-proof or non-incendive (NI) explosion-proof structural standards) or standards other than explosion-proof structural standards (such as general safety standards).

The insulating plate 6 is fixed to the inner surface of the main wall 12 via an adhesive member 16, such as double-sided tape or adhesive. Instead of or in addition to being fixed by such an adhesive member 16, the insulating plate 6 may be fixed to the inner surface of the main wall 12 by being fitted onto the main housing 2 by snap fitting (such as snap fitting via a plurality of claws aligned on the inner circumferential surface of the circumferential wall 15 at intervals in the circumferential direction), pressure fitting, or the like. Instead of or in addition to such fixing, the insulating plate 6 may also be fixed by being tightened by a fastener, such as a headed screw, to the inner surface of the main wall 12. The fastener for fixing the insulating plate 6 to the inner surface of the main wall 12 preferably has insulating properties. The insulating plate 6 may be fixed to the inner surface of the main wall 12 by the aforementioned fitting, fastener, or the like in a state such that the insulating plate 6 touches the inner surface of the main wall 12 without the adhesive member 16 or the like therebetween.

The insulating cover 7 covers the surface of the circuit board 5 on the opposite side from the main wall 12 (i.e. the upper surface) and has insulating properties. The insulating cover 7 may be made of synthetic resin, such as polycarbonate resin. The insulating cover 7 includes a cover body 7*a*, concentric with the central axis O and shaped as a topped cylinder covering the electronic components 11 mounted on the upper surface of the board body 10, and an annular plate-shaped flange 7*b* that extends radially outward from the lower edge of the cover body 7*a*. The circumferential edge of the circuit board 5 and the flange 7*b* of the insulating cover 7 are jointly fastened to the board attachment portion 13 by fasteners 17 configured by headed screws. In other words, a screw hole is provided on the upper surface of each convex portion 14*a*, and a through-hole penetrating the fastener 17 is provided at the position corresponding to each screw hole on both the outer circumferential edge of the circuit board 5 and the flange 7*b* of the insulating cover 7. The insulating cover 7 may, however, be configured not to be jointly fastened with the circuit board 5. The shape and arrangement of the insulating cover 7 can also be changed as necessary. A configuration omitting the insulating cover 7 may also be adopted.

The sub-housing 3 includes a tubular tube wall 18 concentric with the central axis O and an upper wall 19 integrally connected with the upper edge of the tube wall 18. The tube wall 18 is a circular tube but may instead be a truncated cone or other tubular shape. The tube wall 18 is removably attached to the circumferential wall 15 of the main housing 2 by appropriate means. The tube wall 18 is arranged along the top surface of the circumferential wall 15, but alternatively or additionally may be arranged along the outer circumferential surface of the circumferential wall 15. The tube wall 18 may alternatively or additionally be arranged along the inner circumferential surface of the circumferential wall 15. The internal space of the housing 4 is sealed by the sub-housing 3 being configured so that the tube wall 18 of the sub-housing 3 is attached to the circumferential wall 15 of the main housing 2. The sub-housing 3 is not, however, limited to this configuration.

The sub-housing 3 is made of synthetic resin that has insulating properties. The wireless communication module 8 and the power supply 9 are housed inside the sub-housing 3. The wireless communication module 8 and the power supply 9 are attached to the inner circumferential surface of the tube wall 18 via an attachment plate 20. The wireless communication module 8 is constituted by a circuit board, but the configuration thereof can be changed as necessary. The wireless communication module 8, the power supply 9, and the circuit board 5 are electrically connected to each other. The power supply 9 and the wireless communication module 8 are electrically connected to each other by a non-illustrated connection method. The wireless communication module 8 and the circuit board 5 are electrically connected to each other by a connector 21 that penetrates the attachment plate 20 and the insulating cover 7. The connector 21 is formed by an electronic component 22 mounted on the wireless communication module 8 and an electronic component 11 mounted on the upper surface of the circuit board 5 as an insertion component 11a. The structure for the wireless communication module 8, the power supply 9, and the circuit board 5 to be electrically connected to each other is not, however, limited to this example and may be changed as appropriate. The power supply 9 supplies power to the wireless communication module 8 and the circuit board 5. The circuit board 5 measures temperature, pressure, flow rate, vibration, or the like. The wireless communication module 8 wirelessly transmits the measurement result to an external device. The sub-housing 3 does not have conductivity that would obstruct radio waves, thereby allowing stable wireless communication by the wireless communication module 8.

The electrical device 1 is not limited to wireless communication with an external device via the wireless communication module 8. For example, the electrical device 1 may be configured for wireless communication via an antenna attached to the outside of the housing 4 or may be configured for wired communication with an external device via a wired communication module provided in place of the wireless communication module 8. Accordingly, the sub-housing 3 is not limited to being made of a material without conductivity that would obstruct radio waves. The sub-housing 3 is not limited to synthetic resin and may, for example, be metallic.

The insulating plate 6 can provide efficient insulation between the circuit board 5 and the main wall 12 of the metallic main housing 2 in the electrical device 1. The gap D necessary for insulation between the board body 10 and the upper surface of the main wall 12 can therefore be reduced, enabling a reduction in size of the electrical device 1 or compliance with restrictions on the size of electronic components 11 usable to configure the circuit board 5. Furthermore, the insulating plate 6 has withstand voltage characteristics conforming to the requirements of solid insulation in the intrinsically safe explosion-proof structural standards and a thickness conforming to the requirements of separation distance through solid insulation in the intrinsically safe explosion-proof structural standards. The gap D necessary for the electrical device 1 to conform to intrinsically safe explosion-proof structural standards can therefore be reduced. For example, when the voltage (crest value) generated between the main housing 2 and the circuit board 5 is 10 V or less, the separation distance between the bottom of the electronic components 11 (i.e. the portion at the lowest position among the pin bottom of the insertion components 11a mounted on the upper surface of the board body 10, the bottom surface of the insertion components 11a mounted on the lower surface of the board body 10, and the bottom surface of the surface mounted components 11b mounted on the lower surface of the board body 10) and the upper surface of the main wall 12 needs to be 1.5 mm or more when the insulating plate 6 is not provided. By contrast, when the insulating plate 6 is provided, the thickness of the insulating plate 6 may be 0.5 mm, and no separation distance is required between the bottom of the electronic components 11 and the upper surface of the insulating plate 6. The gap D necessary for conformity with intrinsically safe explosion-proof structural standards can therefore be reduced by a maximum of 1.0 mm (when the adhesive member 16 is not provided).

Figure 2:
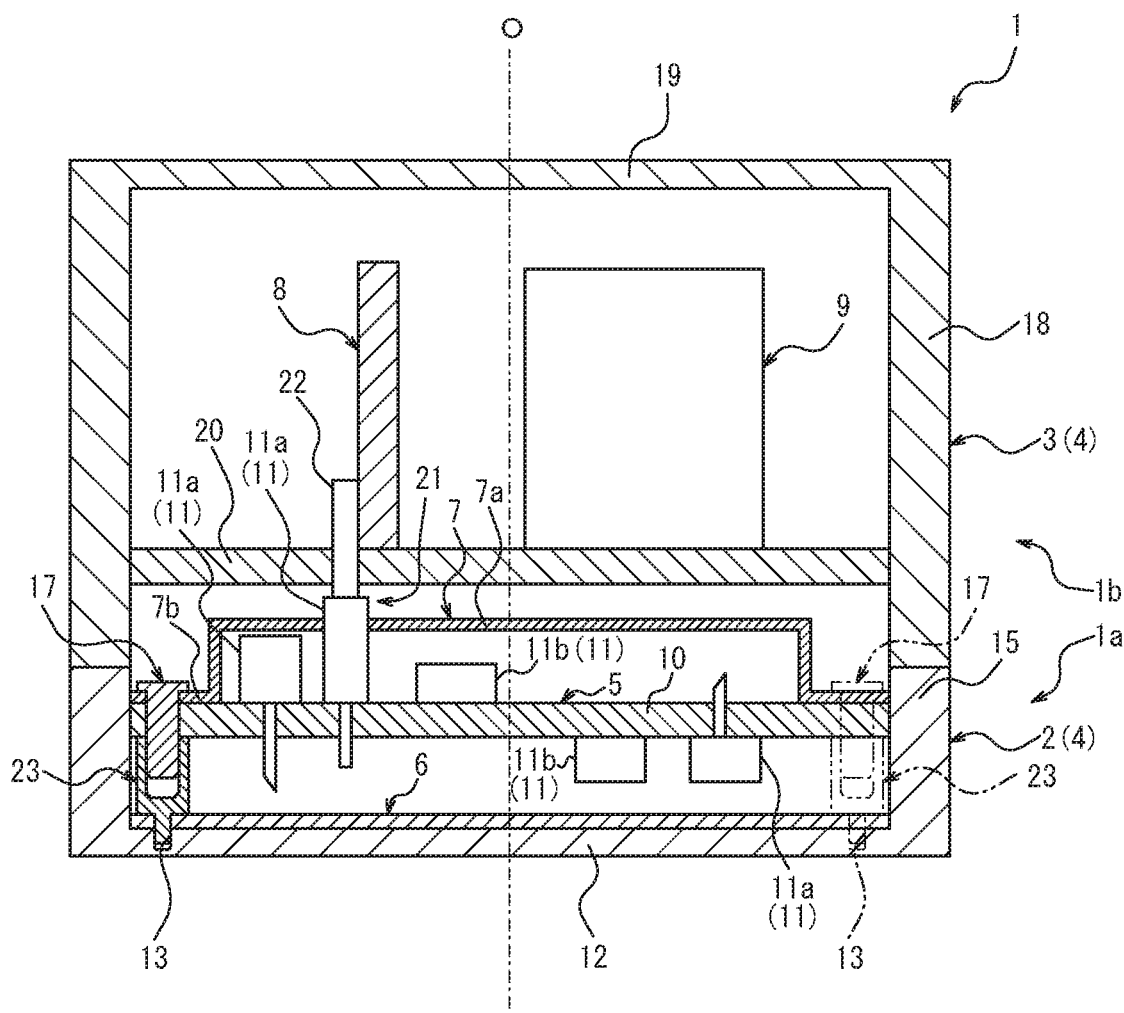
FIG. 2 is a cross-sectional diagram illustrating an electrical device according to a second embodiment.

Next, an electrical device 1 according to a second embodiment is described with reference to FIG. 2. In FIG. 2, elements corresponding to the elements illustrated in the first embodiment are labeled with the same reference signs. As illustrated in FIG. 2, the electrical device 1 according to the present embodiment has a board attachment portion 13 provided on the inner surface of a main wall 12. A board body 10 of a circuit board 5 is attached via studs 23 to the board attachment portion 13 provided on the inner surface of a main wall 12, and an insulating plate 6 is fixed by being fastened to the inner surface of the main wall 12 by the studs 23. The studs 23 are attached at positions corresponding to the convex portions 14a illustrated in the first embodiment. In the present embodiment, an insulating cover 7 and the board body 10 are jointly fastened to the studs 23 by a fastener 17. The remaining configuration is similar to that of the first embodiment.

Figure 3:
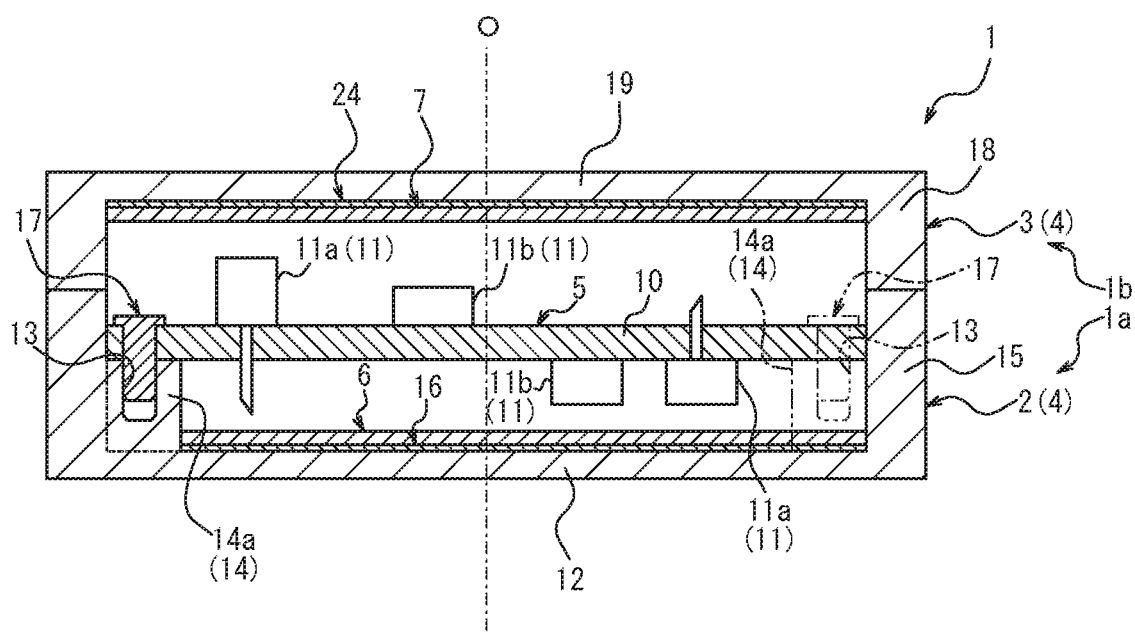
FIG. 3 is a cross-sectional diagram illustrating an electrical device according to a third embodiment.

Next, an electrical device 1 according to a third embodiment is described with reference to FIG. 3. Elements corresponding to the elements illustrated in the first embodiment are labeled with the same reference signs in FIG. 3. As illustrated in FIG. 3, the electrical device 1 according to the present embodiment does not include either the wireless communication module 8 or the connector 21. Furthermore, a sub-housing 3 is metallic. The electrical device 1 may include a power supply inside the housing 4 or may be configured to connect to an external power supply. An insulating cover 7 is fixed to the inner surface (i.e., the lower surface) of an upper wall 19 of the sub-housing 3. The insulating cover 7 covers the surface of a circuit board 5 on the opposite side from a main wall 12 (i.e. the upper surface) and has insulating properties. The insulating cover 7 may be made of synthetic resin, such as polycarbonate resin. The insulating cover 7 is a circular plate, concentric with the central axis O, that covers electronic components 11 mounted on the upper surface of the board body 10. The insulating cover 7 is fixed to the inner surface of the upper wall 19 via an adhesive member 24, such as double-sided tape or adhesive. The insulating cover 7 may be fixed to the inner surface of the upper wall 19 by fitting, by a fastener, or the like instead of or in addition to the adhesive member 24. The electrical device 1 is configured by main housing-side components 1a (component for electrical device), which include a main housing 2 and the components housed inside the main housing 2 (such as the circuit board 5 and an insulating plate 6), and sub-housing-side components 1b, which include the sub-housing 3 and the components housed in the sub-housing 3 (such as the insulating cover 7). The remaining configuration is similar to that of the first embodiment.

The above embodiment is only an example of the present disclosure, and a variety of modifications may be made.

The invention claimed is:

1. An electrical device comprising:
a housing comprising a metallic main housing to be attached to an installation section and a sub-housing attached to the main housing; and
a circuit board housed inside the housing;
wherein the main housing comprises a main wall, extending along the circuit board with a gap between the main wall and the circuit board, and a board attachment portion having the circuit board attached thereto;
wherein an insulating plate having insulating properties is fixed to an inner surface of the main wall;
wherein the electrical device further comprises an insulating cover having insulating properties and covering a surface of the circuit board on an opposite side from the main wall;
wherein the board attachment portion is provided on the inner surface of the main wall;
wherein the circuit board is attached via a stud to the board attachment portion provided on the inner surface of the main wall; and
wherein the insulating plate is fixed by being fastened to the inner surface of the main wall by the stud.

2. The electrical device of claim 1, wherein the circuit board and the insulating cover are jointly fastened to the board attachment portion by a fastener.

3. The electrical device of claim 1,
wherein the main housing comprises a protrusion protruding from the inner surface of the main wall; and
the board attachment portion is provided on the protrusion.

4. The electrical device of claim 1, wherein the sub-housing has insulating properties, and a wireless communication module is housed inside the sub-housing.

5. A component for an electrical device comprising:
a metallic main housing to be attached to an installation section; and
a circuit board;
wherein the main housing comprises a main wall, extending along the circuit board with a gap between the main wall and the circuit board, and a board attachment portion having the circuit board attached thereto;
wherein an insulating plate having insulating properties is fixed to an inner surface of the main wall:
wherein the electrical device further comprises an insulating cover having insulating properties and covering a surface of the circuit board on an opposite side from the main wall;
wherein the board attachment portion is provided on the inner surface of the main wall;
wherein the circuit board is attached via a stud to the board attachment portion provided on the inner surface of the main wall; and
wherein the insulating plate is fixed by being fastened to the inner surface of the main wall by the stud.

* * * * *